(12) United States Patent
Xu et al.

(10) Patent No.: US 9,419,587 B1
(45) Date of Patent: Aug. 16, 2016

(54) METHOD AND APPARATUS TO RECONFIGURE A FILTER

(71) Applicant: Marvell International Ltd., Hamilton (BM)

(72) Inventors: Zhigang Xu, Shanghai (CN); Junxiong Deng, San Diego, CA (US); Taotao Yan, Shanghai (CN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/731,178

(22) Filed: Jun. 4, 2015

Related U.S. Application Data

(60) Provisional application No. 62/008,847, filed on Jun. 6, 2014.

(51) Int. Cl.
| | | |
|---|---|---|
| *H03K 5/00* | (2006.01) | |
| *H03H 21/00* | (2006.01) | |
| *H04B 1/04* | (2006.01) | |
| *H03H 11/04* | (2006.01) | |
| *H03H 11/30* | (2006.01) | |
| *H03D 7/14* | (2006.01) | |
| *H03H 11/28* | (2006.01) | |
| *H03H 11/40* | (2006.01) | |

(52) U.S. Cl.
CPC ......... *H03H 21/0001* (2013.01); *H03D 7/1466* (2013.01); *H03D 7/1491* (2013.01); *H03H 11/0466* (2013.01); *H03H 11/0472* (2013.01); *H03H 11/28* (2013.01); *H03H 11/30* (2013.01); *H04B 1/0475* (2013.01); *H03H 11/40* (2013.01); *H03H 2021/0009* (2013.01); *H03H 2210/017* (2013.01)

(58) Field of Classification Search
CPC .............. H03H 11/11; H03H 11/0405; H03H 2210/00; H03H 2210/017; H03H 11/40; H03H 3/78; H03H 11/30; H03H 11/28
USPC ................................... 327/551–559
See application file for complete search history.

(56) References Cited

U.S. PATENT DOCUMENTS 8,260,212 B2 * 9/2012 Chien ................ H03H 11/1291
455/73
8,538,364 B2 * 9/2013 Katsube ............... H03H 7/0153
327/554

OTHER PUBLICATIONS

Zhigang Xu, et al.: Operational Transconductance Amplifier of Improved Linearity, U.S. Appl. No. 14/731,194, filed Jun. 4, 2015.

* cited by examiner

*Primary Examiner* — Dinh T Le

(57) ABSTRACT

Aspects of the disclosure provide a circuit having a filter circuit and a controller. The filter circuit drives a load circuit having different input impedances under different operation conditions. The filter circuit is configured to have a first output circuit coupled with a first resistor and a second output circuit coupled with a second resistor. The controller is configured to generate control signals to select one of the first output circuit and the second output circuit based on an operation condition of the load circuit.

19 Claims, 3 Drawing Sheets

METHOD AND APPARATUS TO RECONFIGURE A FILTER

INCORPORATION BY REFERENCE

This present disclosure claims the benefit of U.S. Provisional Application No. 62/008,847, "Reconfigurable Low Pass Filter Structure with High Linearity and Low Gain Loss" filed on Jun. 6, 2014, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Filters are widely used in communication devices. In an example, operational transconductance amplifier (OTA) based filters are often used in transmitter circuit and receiver circuit in a communication device. The OTA based filters are required to satisfy, for example, noise and linearity requirements in order for the communication devices to satisfy performance requirements.

SUMMARY

Aspects of the disclosure provide a circuit having a filter circuit and a controller. The filter circuit drives a load circuit having different input impedances under different operation conditions. The filter circuit is configured to have a first output circuit coupled with a first resistor and a second output circuit coupled with a second resistor. The controller is configured to generate control signals to select one of the first output circuit and the second output circuit based on an operation condition of the load circuit.

According to an aspect of the disclosure, the load circuit is a mixer circuit configured to operate in a plurality of frequency bands, and the controller is configured to generate the control signals to select one of the first output circuit and the second output circuit based on an operation frequency of the mixer circuit. In an example, the load circuit includes a voltage mode passive mixer having an input impedance that varies with a frequency of a carrier signal.

In an embodiment, the first resistor has a higher resistance than the second resistor, and the controller is configured to select the first output circuit when the load circuit operates at a first frequency, and select the second output circuit when the load circuit operates at a second frequency that is higher than the first frequency.

In an example, the first output circuit includes a first transistor in a common gate arrangement cascaded with a second transistor in a common source arrangement to form a first driving path to drive an output node coupled with the first resistor, and a third transistor in the common gate arrangement cascaded with a fourth transistor in the common source arrangement to form a second driving path to drive the output node coupled with the first resistor. Further, the first output circuit includes a plurality of switches at gate terminals of the first transistor and the third transistor to be switched on/off to select or dis-select the first output circuit.

In an embodiment, the filter circuit includes an input stage configured to receive an input voltage and amplify the input voltage to generate an intermediate signal that is provided to the first driving path and a level shift circuit configured to voltage-shift the intermediate signal to generate a shifted intermediate signal that is provided to the second driving path.

Aspects of the disclosure provide a method. The method includes determining an operation condition of a load circuit having different input impedance under different operation conditions, generating control signals based the an operation condition, and providing the control signals to select one of a first output circuit and a second output circuit in a filter circuit coupled with the load circuit. The first output circuit is coupled with a first resistor and the second output circuit is coupled with a second resistor.

Aspects of the disclosure provide a transmitter circuit that includes a mixer circuit, a filter circuit, and a controller. The mixer circuit is configured to have different impedances under different operation frequency bands. The filter circuit is configured to have a first output circuit coupled with a first resistor to drive the mixer circuit and a second output circuit coupled with a second resistor to drive the mixer circuit. The controller is configured to generate control signals to select one of the first output circuit and the second output circuit based on an operation frequency of the mixer circuit.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
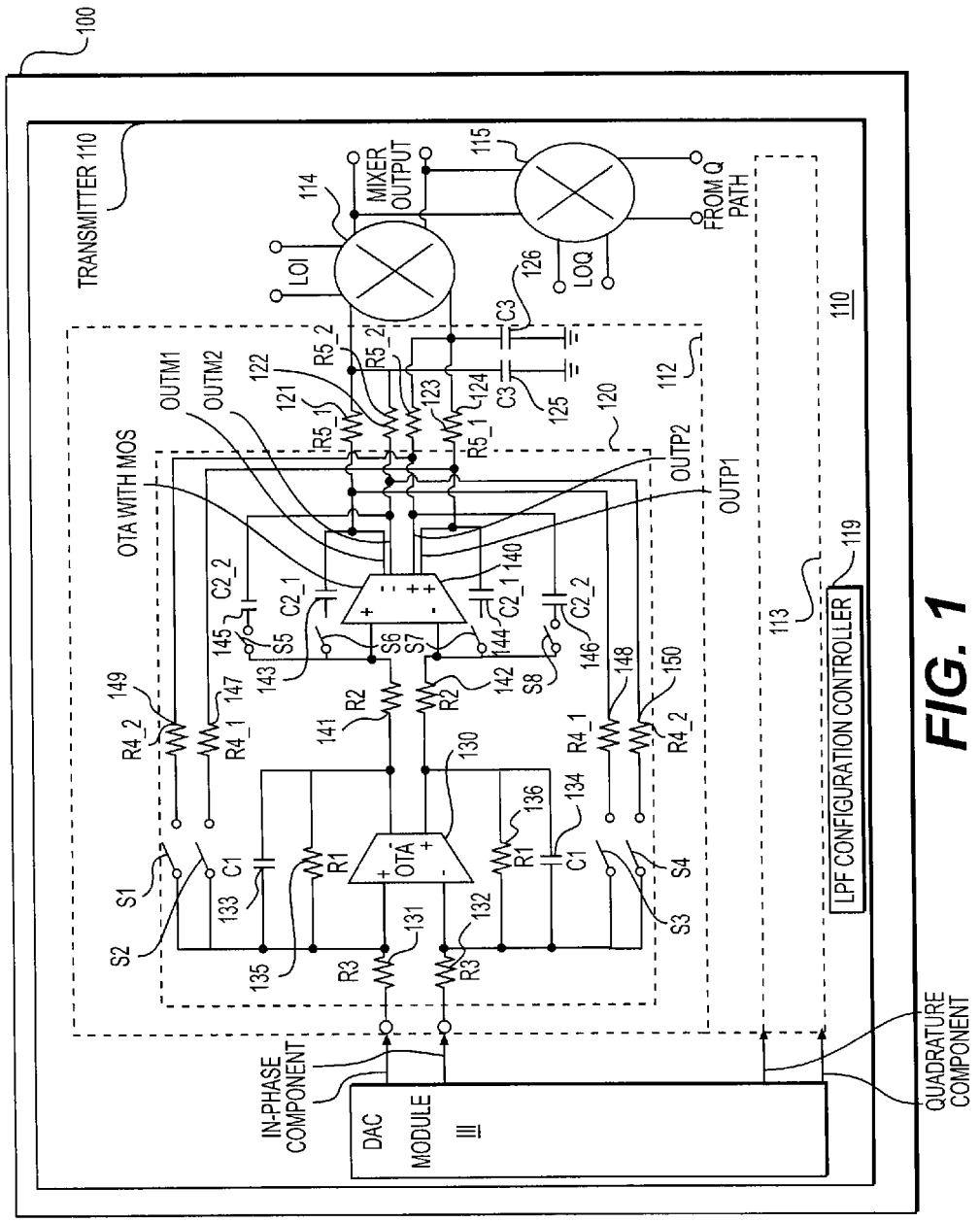
FIG. 1 shows a block diagram of an electronic device 100 according to an embodiment of the disclosure.

FIG. 1 shows a diagram of an electronic device 100 according to an embodiment of the disclosure. The electronic device 100 includes a filter 120 having an output stage with multiple switchable outputs (MOs), and a configuration controller, such as a low pass filter (LPF) configuration controller 119. The configuration controller 119 is configured to generate control signals to switch the outputs of the filter 120 to configure the filter 120 to be used in different operation conditions, such as different frequency bands, and the like.

The electronic device 100 can be any suitable device, such as a desktop computer, a laptop computer, a tablet computer, a smart phone, a network switch, an access point, a router, a set-top box, a television, and the like, that includes a filter which may need to operate in different operation conditions.

In an example, the electronic device 100 is a communication terminal device, such as a smart phone and the like, configured according to a standard for wireless communication, such as a Long-Term Evolution (LTE) standard for wireless communication of high-speed data. The electronic device 100 includes a transmitter 110 configured according to the LTE standard to transmit high speed data. The transmitter 110 has a relatively high requirement for filter linearity and gain loss.

Specifically, in the FIG. 1 example, the transmitter 110 includes various circuit components, such as a digital to analog converter (DAC) module 111, a first processing path (I-path) 112, a second processing path (Q-path) 113, a first mixer 114, a second mixer 115 and the like coupled together as shown in FIG. 1.

In an example, the DAC module 111 respectively converts an in-phase component and a quadrature component of data for transmission from a digital form to an analog form. The first processing path 112 filters the in-phase component to remove/reduce high frequency components that are the noise introduced during processing. The first mixer 114 receives and modulates an in-phase component (LOI) of a carrier signal to carry the in-phase component of the data and generates the in-phase component of the signal for transmission. Similarly, the second processing path 113 filters the quadrature component to remove/reduce high frequency components that are the noise introduced during processing. The second mixer 115 receives and modulates the quadrature component (LOQ) of the carrier signal to carry the quadrature component of the data and generates the quadrature component of the signal for transmission. The in-phase component and quadrature component of the signal for transmission are suitably combined as mixer output.

Specifically, in the FIG. 1 example, the first processing path 112 is a third-order low pass filter that includes an OTA based low pass filter 120 followed by passive low pass filters formed of resistors 121-124 and capacitors 125-126. The OTA based low pass filter 120 is in a differential biquad (second-order) filter topology. In addition, the OTA based low pass filter 120 has multiple pairs of differential outputs, and can selectively drive one pair of differential outputs based on control signals from the LPF configuration controller 119. For example, the low pass filter 120 generates a first pair of differential outputs OUTP1 and OUTM1, and a second pair of differential outputs OUTP2 and OUTM2. Based on the control signals from the LPF configuration controller 119, the OTA based low pass filter 120 can drive the first pair of differential outputs OUTP1 and OUTM1 or can drive the second pair of differential outputs OUTP2 and OUTM2.

The resistors 121-124 and the capacitors 125-126 form passive low pass filters that are coupled to the outputs of the OTA based low pass filter 120 as shown in FIG. 1. Specifically, the resistor 121 is coupled to the output OUTM1 and the capacitor 125, the resistor 122 is coupled to the output OUTM2 and the capacitor 125, the resistor 123 is coupled to the output OUTP2 and the capacitor 126, and the resistor 124 is coupled to the output OUTP1 and the capacitor 126. The resistors 121 and 124 have a same resistance of R5_1, and the resistors 122 and 123 have a same resistance of R5_2. The capacitors 125 and 126 have a same capacitance C3.

In an embodiment, the first mixer 114 is a voltage mode passive mixer with input impedance varying with frequency. For example, the input impedance is high when the carrier signal is in a low frequency band, and the input impedance is low when the carrier signal is in a medium frequency band. According to an aspect of the disclosure, in order to keep relatively constant gain by the third-order low pass filter in the processing path 112 across multiple frequency bands, the OTA based low pass filter 120 selectively drives a pair of differential outputs according to the frequency of the carrier signal.

In an example, R5_1 is about 100 ohm and R5_2 is about 50 ohm. When the carrier signal is in a first frequency band, the OTA based low pass filter 120 drives the outputs OUTP1 and OUTM1; and when the carrier signal is in a second frequency band with higher frequencies than the first frequency band, the OTA based low pass filter 120 drives the outputs OUTP2 and OUTM2.

In a related example, an OTA based low pass filter drives a single pair of outputs. Further, switches are used to couple the outputs to different resistors. In the related example, the switches can cause gain loss. To reduce gain loss, the switches are implemented using large size transistors. The large size transistors introduce excessive parasitic capacitance, and affect OTA stability.

According to an aspect of the disclosure, the OTA based low pass filter 120 is implemented using OTAs with high linearity to improve the filter linearity. Specifically, the OTA based low pass filter 120 includes a first OTA 130, a second OTA 140, resistors 131-132 of resistance R3, resistors 135-136 of resistance R1, resistors 141-142 of R2, resistors 147-148 of resistance R4_1, resistors 149-150 of resistance R4_2, capacitors 133-134 of capacitance C1, capacitors 143-144 of capacitance C2_1, capacitors 145-146 of capacitance C2_2. Further, the OTA based low pass filter 120 includes a plurality of switches S1-S8. The switches S1-S8 are switched on/off based on control signals provided by the LPF configuration controller 119. These elements are coupled together as shown in FIG. 1.

In the FIG. 1 example, the first OTA 130, the resistors 131-132 and 135-136 and the capacitors 133-134 form a leaky integrator. The switches S5-S8 selectively couple the capacitors 143-144 or the capacitors 145-146 with the second OTA 140 and the resistors 141-142 to form an integrator. Further, the switches S1-S4 selectively couple the resistors 147-148 or the resistors 149-150 with the leaky integrator and the integrator to form the OTA based low pass filter 120 which is a second-order (biquad) low pass filter.

According to an aspect of the disclosure, the second OTA 140 has an output stage having multiple output circuits that respectively drive the multiple pair of differential outputs. In an embodiment, the second OTA 140 can be controlled to select one of the output circuits to drive one pair of differential the multiple outputs, and disconnect the other outputs circuits. In the FIG. 1 example, the second OTA 140 can be controlled to drive the first pair of differential outputs OUTP1 and OUTM1 or can be controlled to drive the second pair of differential outputs OUTP2 and OUTM2. The first OTA 130 can be implemented using any suitable topology.

In an embodiment, the LPF configuration controller 119 is configured to generate control signals based on the frequency of a local oscillator (LO) signal, and provide the control signals to control the switches S1-S8 and the second OTA 140. In an example, the carrier signal is generated based on the local oscillator signal. For example, when the frequency of the LO signal is in a first frequency band, the LPF configuration controller 119 is configured to generate the control signals to close the switches S2, S3, S6 and S7, open the switches S1, S4, S5 and S8, and control the second OTA 140 to drive the first pair of differential outputs OUTP1 and OUTM1; and when the frequency of the LO signal is in a second frequency band with frequencies higher than the first frequency band, the LPF configuration controller 119 is configured to generate the control signals to open the switches S2, S3, S6 and S7, close the switches S1, S4, S5 and S8, and control the second OTA 140 to drive the second pair of differential outputs OUTP2 and OUTM2.

The LPF configuration controller 119 can be implemented using various techniques. In an example, the LPF configuration controller 119 is implemented using circuits. In another example, the LPF configuration controller 119 is implemented as a processing circuitry executing software instructions.

It is noted that, in an example, the transmitter 110 includes other components that are not shown, such as power amplifier, encoder, and the like. In an embodiment, the transmitter 110 is integrated with other circuit on an integrated circuit (IC) chip.

It is also noted that the OTA based low pass filter 120 can be suitably modified to have more than two pair of differential outputs.

It is also noted that the second processing path 113 can be similarly configured as the first processing path 112.

Figure 2:
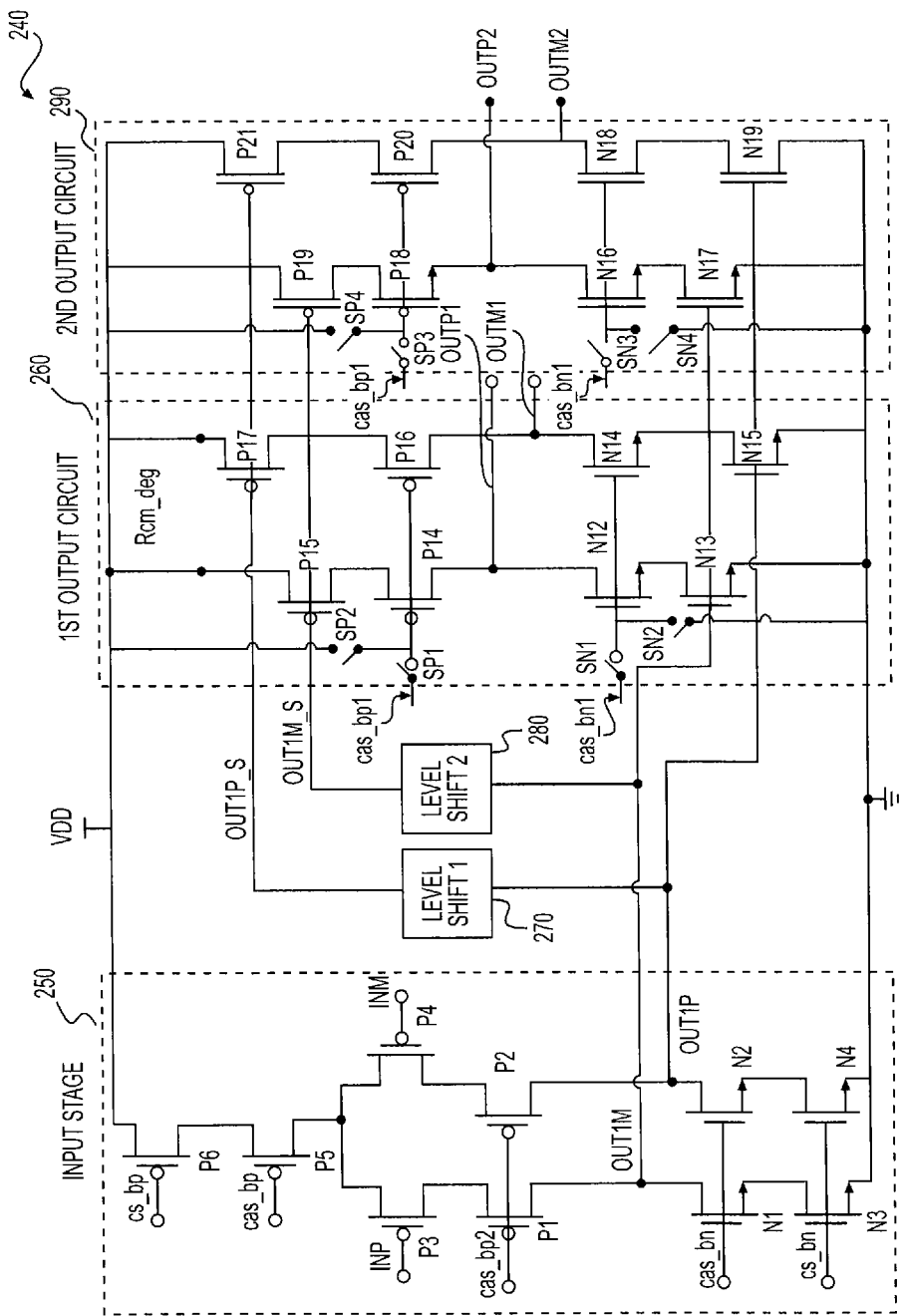
FIG. 2 shows a schematic diagram of an operational transconductance amplifier 240 according to an embodiment of the disclosure.

FIG. 2 shows a schematic diagram of an operational transconductance amplifier (OTA) 240 according to an embodiment of the disclosure. The OTA 240 includes an input stage 250, a first level shift circuit 270, a second level shift circuit 280, and an output stage having a first output circuit 260 to drive a first pair of differential outputs OUTP1 and OUTM1, and a second output circuit 290 to drive a second pair of differential outputs OUTP2 and OUTM2. The first output circuit 260 and the second output circuit 290 can be selected to drive the first pair of differential outputs OUTP1 and OUTM1 or the second pair of differential outputs OUTP2 and OUTM2. In an example, the OTA 240 can be used in the FIG. 1 example as the second OTA 140.

In the FIG. 2 example, the input stage 250 receives a pair of differential voltage inputs INP and INM, amplifies, and outputs a pair of differential intermediate outputs OUT1P and OUT1M. The input stage 250 includes N-type metal-oxide-semiconductor field effect transistor (MOSFET) transistors N1-N4 and P-type MOSFET transistors P1-P6 coupled together as shown in FIG. 2.

Specifically, the P-type MOSFET transistors P3 and P1 are cascaded to form a first cascode amplifier with the P-type MOSFET transistor P3 in a common-gate arrangement and the P-type MOSFET transistor P1 in a common-source arrangement. Similarly, the P-type MOSFET transistor P4 and P2 are cascaded to form a second cascode amplifier. The first cascode amplifier and the second cascode amplifier are coupled to form a differential pair to receive the differential voltage inputs INP and INM. The P-type MOSFET transistor P5 and P6 form PMOS cascode current source with both transistors in the common-gate arrangement. The N-type MOSFET transistors N1 and N3 are cascaded to form a first NMOS cascode current source and the N-type MOSFET transistors N2 and N4 are cascaded to form a second NMOS cascode current source. The first NMOS cascode current source and the second NMOS cascode current source are coupled with the cascode differential amplifier to act as NMOS cascode loads.

During operation, in an example, when the differential voltage inputs INP and INM are of the same voltage level, the first cascode amplifier and the second cascode amplifier are balanced, and the current provided by the PMOS cascode current source is equally divided between the first and second cascode amplifier. In an example, the first NMOS cascode current source and the second NMOS cascode current source are configured to each conduct one half of the current as the PMOS cascode current source, then the differential intermediate outputs OUT1M and OUT1P are of the same voltage level.

When the differential voltage inputs INP and INM are of different voltage levels, the current provided by the PMOS cascode current source is imbalanced between the first cascode amplifier and the second cascode amplifier. In an example, the first NMOS cascode current source and the second NMOS cascode current source are configured to each conduct one half of the current as the PMOS cascode current source, then the differential intermediates outputs OUT1M and OUT1P are of different voltage levels and have output current.

The first level shift circuit 270 and the second level shift circuit 280 suitably shift the intermediate outputs OUT1P and OUT1M to generate the shifted intermediate output OUT1P_S and OUT1M_S to enable a class AB arrangement at the first output circuit 260 and the second output circuit 290.

The first output circuit 260 is configured to operate in class AB arrangement to drive the first pair of differential current outputs OUTP1 and OUTM1. According to the class AB arrangement, an output node is driven by two switching paths, and each of the switching paths has a conduction angle larger than 180° in response to an input. In an example, when the input is a sinusoidal signal. One of the switching paths drives the output node when the input has an angle in the range of [0°, 180°], and other switching path drives the output node when the input has an angle in the range of [180°, 360°]. The conduction angles of the two switching path overlap at about 0° and about 180°.

In the FIG. 2 example, the first output circuit 260 includes N-type MOSFET transistors N12-N15, and P-type MOSFET transistors P14-P17 coupled together as shown in FIG. 2.

In the example, the N-type MOSFET transistors N12 and N13 form a first NMOS cascode amplifier to drive the current output OUTP1 in response to the intermediate output OUT1M, the N-type MOSFET transistors N14 and N15 form a second NMOS cascode amplifier to drive the current output OUTM1 in response to the intermediate output OUT1P.

Similarly, the P-type MOSFET transistors P14 and P15 form a first PMOS cascode amplifier to drive the current output OUTP1 in response to the shifted intermediate output OUT1M_S, and the P-type MOSFET transistors P16 and P17 form a second PMOS cascode amplifier to drive the current output OUTM1 in response to the shifted intermediate output OUT1P-S.

According to an aspect of the disclosure, the first output circuit 260 is suitably biased and controlled to operate in class AB arrangement, such that the first cascode PMOS amplifier and the first cascode NMOS amplifier are not simultaneously off, and the second cascode PMOS amplifier and the second cascode PMOS amplifier are not simultaneously off.

The first level shifter 270 and the second level shifter 280 can use any suitable technique to shift the intermediate outputs OUT and OUT to enable the class AB arrangement.

The second output circuit 290 is similarly configured as the first output circuit 260 to operate in class AB arrangement to drive the second pair of differential current outputs OUTP2 and OUTM2. In the FIG. 2 example, the second output circuit 290 includes N-type MOSFET transistors N16-N19, and P-type MOSFET transistors P18-P21 coupled together as shown in FIG. 2.

In the example, the N-type MOSFET transistors N16 and N17 form a first NMOS cascode amplifier to drive the current output OUTP2 in response to the intermediate output OUT1M, the N-type MOSFET transistors N18 and N19 form a second NMOS cascode amplifier to drive the current output OUTM2 in response to the intermediate output OUT1P.

Further, the P-type MOSFET transistors P18 and P19 form a first PMOS cascode amplifier to drive the current output OUTP2 in response to the shifted intermediate output OUT1M_S, and the P-type MOSFET transistors P20 and P21 form a second PMOS cascode amplifier to drive the current output OUTM2 in response to the shifted intermediate output OUT1P-S.

Similarly configured as the first output circuit 260, the second output circuit 290 is suitably biased and controlled to operate in class AB arrangement, such that the first cascode PMOS amplifier and the first cascode NMOS amplifier are not simultaneously off, and the second cascode PMOS amplifier and the second cascode PMOS amplifier are not simultaneously off.

The OTA 240 includes switches SN1-SN4 and SP1-SP4 that are controlled to select the first output circuit 260 or the second output circuit 290. In an embodiment, the switches SN1-SN4 and SP1-SP4 are implemented using transistors.

In an example, to select the first output circuit 260, the switches SP1, SN1, SP4 and SN4 are closed, and the switches SP2, SN2, SP3, and SN3 are open; and to select the second output circuit 290, the switches SP1, SN1, SP4 and SN4 are open, and the switches SP2, SN2, SP3, and SN3 are closed. In an embodiment, the switches SN1-SN4 and SP1-SP4 are controlled according to signals generated by a configuration controller, such as the LPF configuration controller 119.

According to an aspect of the disclosure, the switches SN1-SN4 and SP1-SP4 are coupled to gate terminals of the transistors N12, N14, N16, N18, P15, P16, P18 and P20 having the common-gate arrangement to select the first output circuit 260 or the second output circuit 290. The switches SN1-SN4 and SP1-SP4 are not on the signal amplification path. Thus, the switches SN1-SN4 and SP1-SP4 do not cause gain loss and thus can be implemented using relatively small size transistors to increase LPF stability. In addition, the resistor adjustment for the passive low pass filter does not affect the LPF linearity.

It is noted that the OTA 240 can include other suitable circuits that are not shown. In an example, the OTA 240 includes a bias circuit (not shown) to generate suitable bias voltages, such as cs_bp, cas_bp, cas_bp1, cas_bp2, cs_bn, cas_bn, cas_bn1 and the like.

In a simulation example, the OTA 240 is used in the processing path 112. The processing path 112 achieves 37.5 dBc improvement in the third-order harmonic distortion, more than 10° phase margin improvement, and about 1 dB voltage swing improvement.

Figure 3:
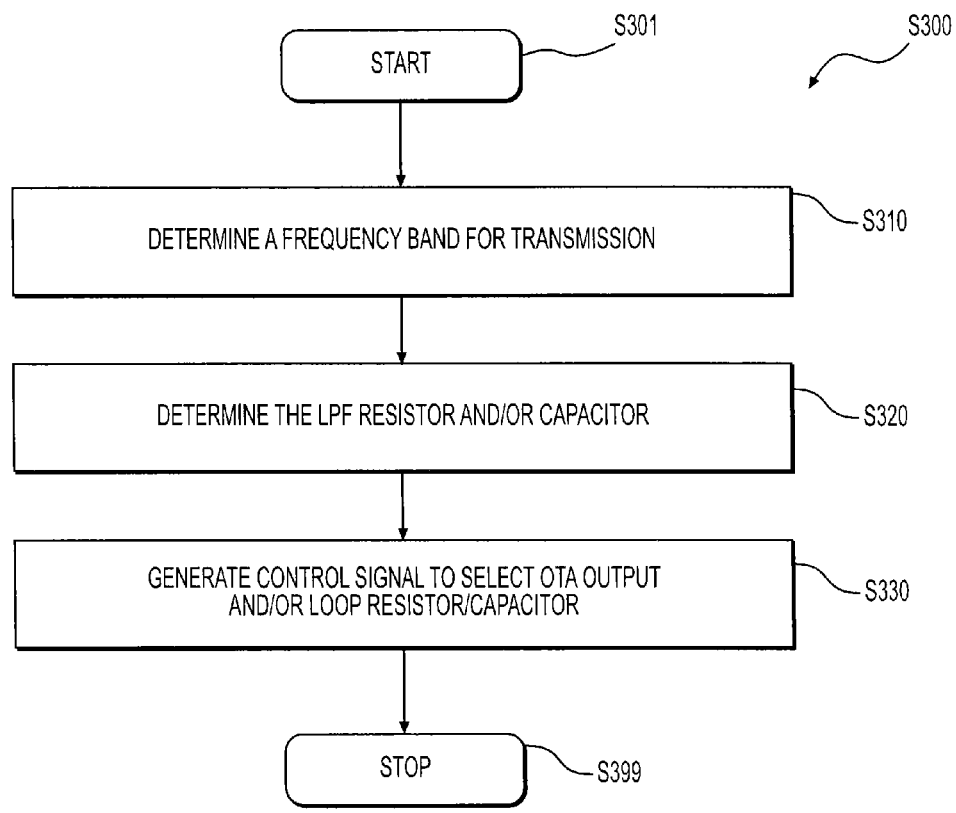
FIG. 3 shows a flow chart outlining a process example 300 according to an embodiment of the disclosure.

FIG. 3 shows a flow chart outlining a process example 300 according to an embodiment of the disclosure. In an example, the process 300 is executed by the LPF configuration controller 119 to generate control signals to configure the first processing path 112 and the second processing path 113. The process starts at S301 and proceeds to S310.

At S310, a frequency band for transmission is determined. In an example, signals indicative of a frequency of a local oscillator (LO) are provided to the LPF configuration controller 119. The LO generates a periodic signal of the frequency, and the periodic signal is used as a carrier signal for transmission in an example. The LPF configuration controller 119 determines the frequency band of the frequency for transmission.

At S320, resistors and capacitors are determined. In an example, the LPF configuration controller 119 determines suitable resistors and capacitors to use in the first processing path 112 and the second processing path 113 to achieve a relatively constant low pass filter gain across frequency bands.

At S330, control signals to control the switches to select OTA outputs, resistors and capacitors are generated and provided to the suitable switches. For example, the LPF configuration controller 119 generates suitable control signals to control the switches SN1-SN4 and SP1-SP4 to select an output circuit coupled to the determined resistors for the passive low pass filters. Further, the LPF configuration controller 119 generates and provides suitable control signals to control the switches S1-S8. Then, the process proceeds to S399 and terminates.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
a filter circuit comprising a transconductance amplifier having a first output circuit coupled with a first resistor and a second output circuit coupled with a second resistor, the filter circuit driving a load circuit having different input impedances under different operation conditions of the load circuit; and
a controller coupled to the load circuit and configured to generate control signals to selectively couple one of the first output circuit and the second output circuit to the load circuit based on an operation condition of the load circuit to provide a constant gain for the filter circuit.

2. The circuit of claim 1, wherein the load circuit is a mixer circuit configured to operate in a plurality of frequency bands.

3. The circuit of claim 2, wherein the controller is configured to generate the control signals to select one of the first output circuit and the second output circuit based on an operation frequency of the mixer circuit.

4. The circuit of claim 2, wherein the load circuit includes a voltage mode passive mixer having an input impedance that varies with a frequency of a carrier signal.

5. The circuit of claim 4, wherein the first resistor has a higher resistance than the second resistor, and the controller is configured to select the first output circuit when the load circuit operates at a first frequency, and select the second output circuit when the load circuit operates at a second frequency that is higher than the first frequency.

6. The circuit of claim 1, wherein the first output circuit comprises:
a first transistor in a common gate arrangement cascaded with a second transistor in a common source arrangement to form a first driving path to drive an output node coupled with the first resistor; and
a third transistor in the common gate arrangement cascaded with a fourth transistor in the common source arrangement to form a second driving path to drive the output node coupled with the first resistor.

7. The circuit of claim 6, wherein the first output circuit further comprises:
a plurality of switches at gate terminals of the first transistor and the third transistor to be switched on/off to select or dis-select the first output circuit.

8. The circuit of claim 7, wherein the filter circuit further comprises:
an input stage configured to receive an input voltage and amplify the input voltage to generate an intermediate signal that is provided to the first driving path; and
a level shift circuit configured to voltage-shift the intermediate signal to generate a shifted intermediate signal that is provided to the second driving path.

9. A method, comprising:
driving, by a filter circuit, a load circuit having different input impedances under different operation conditions of the load circuit, the filter circuit comprising a transconductance amplifier having a first output circuit coupled with a first resistor and a second output circuit coupled with a second resistor; and generating control signals by a controller to selectively couple one of the first output circuit and the second output circuit to the load circuit based on an operation condition of the load circuit to provide a constant gain for the filter circuit.

10. The method of claim 9, wherein determining the operation condition of the load circuit having the different input impedance under the different operation conditions further comprises:

determining an operation frequency of a mixer circuit configured to operate in a plurality of frequency bands.

11. The method of claim 10, wherein generating control signals based the operation condition further comprises:

generating the control signals based on the operation frequency of the mixer circuit.

12. The method of claim 10, wherein determining the operation frequency of the mixer circuit configured to operate in the plurality of frequency bands further comprises:

determining the operation frequency of a voltage mode passive mixer having an input impedance that varies with a frequency of a carrier signal.

13. The method of claim 12, wherein providing the control signals to select one of the first output circuit and the second output circuit in the filter circuit coupled with the load circuit further comprises:

selecting the first output circuit when the load circuit operates at a first frequency, and selecting the second output circuit when the load circuit operates at a second frequency that is higher than the first frequency when the first resistor has a higher resistance than the second resistor.

14. The method of claim 9, further comprising:

providing the control signals to switches coupled to gate terminals of transistors in a common-gate arrangement in the first output circuit and the second output circuit.

15. A transmitter circuit, comprising:

a mixer circuit configured to have different impedances under different operation frequency bands;

a filter circuit comprising a transconductance amplifier having a first output circuit coupled with a first resistor to drive the mixer circuit and a second output circuit coupled with a second resistor to drive the mixer circuit; and a controller coupled to the mixer circuit and configured to generate control signals to selectively couple one of the first output circuit and the second output circuit to the mixer circuit based on an operation frequency of the mixer circuit to provide a constant gain for the filter circuit.

16. The transmitter circuit of claim 15, wherein the first resistor has a higher resistance than the second resistor, and the controller is configured to select the first output circuit when the mixer circuit operates at a first frequency, and select the second output circuit when the mixer circuit operates at a second frequency that is higher than the first frequency.

17. The transmitter circuit of claim 15, wherein the first output circuit comprises:

a first transistor in a common gate arrangement cascaded with a second transistor in a common source arrangement to form a first driving path to drive an output node coupled with the first resistor; and a third transistor in the common gate arrangement cascaded with a fourth transistor in the common source arrangement to form a second driving path to drive the output node coupled with the first resistor.

18. The transmitter circuit of claim 17, wherein the first output circuit further comprises:

a plurality of switches at gate terminals of the first transistor and the third transistor to be switched on/off to select or dis-select the first output circuit.

19. The transmitter circuit of claim 18, wherein the filter circuit further comprises:

an input stage configured to receive an input voltage and amplify the input voltage to generate an intermediate signal that is provided to the first driving path; and a level shift circuit configured to voltage-shift the intermediate signal to generate a shifted intermediate signal that is provided to the second driving path.

* * * * *